US012628399B2

(12) United States Patent
Dezelah et al.

(10) Patent No.: US 12,628,399 B2
(45) Date of Patent: May 12, 2026

(54) METHODS AND SYSTEMS FOR FORMING A LAYER COMPRISING A GROUP 13 ELEMENT ON A SUBSTRATE

(71) Applicant: ASM IP Holding B.V., Almere (NL)

(72) Inventors: Charles Dezelah, Helsinki (FI); Petro Deminskyi, Helsinki (FI); Qi Xie, Shanghai (CN)

(73) Assignee: ASM IP Holding B.V., Almere (NL)

( * ) Notice: Subject to any disclaimer, the term of this patent is extended or adjusted under 35 U.S.C. 154(b) by 412 days.

(21) Appl. No.: 18/202,336

(22) Filed: May 26, 2023

(65) Prior Publication Data

US 2023/0386846 A1     Nov. 30, 2023

Related U.S. Application Data

(60) Provisional application No. 63/346,924, filed on May 30, 2022.

(51) Int. Cl.
*H01L 21/28*     (2025.01)
*H10D 64/01*     (2025.01)

(52) U.S. Cl.
CPC ............................. *H10D 64/01318* (2026.01)

(58) Field of Classification Search
CPC ......... H01L 21/28088; C23C 16/45553; C23C 16/14; H10D 64/01318
See application file for complete search history.

(56) References Cited

U.S. PATENT DOCUMENTS

| | | | |
|---|---|---|---|
| 2007/0049053 A1 | 3/2007 | Mahajani | |
| 2015/0325447 A1* | 11/2015 | Ogawa | ............. C23C 16/45523 118/704 |
| 2018/0286675 A1 | 10/2018 | Blomberg | |
| 2020/0328285 A1* | 10/2020 | Haukka | ............. C23C 16/45523 |

* cited by examiner

*Primary Examiner* — Victor A Mandala
*Assistant Examiner* — Colleen E Snow
(74) *Attorney, Agent, or Firm* — Laine IP Oy; Mark W. Scott

(57)     ABSTRACT

Disclosed are methods and systems for depositing layers comprising a Group 13 element on a surface of a substrate via contacting the substrate with at least a vapor-phase first precursor and a vapor-phase second precursor comprising an alkyl halide. Exemplary structures in which the layers may be incorporated include field effect transistors, VNAND cells, and metal-insulator-metal (MIM).

22 Claims, 8 Drawing Sheets

300

600

METHODS AND SYSTEMS FOR FORMING A LAYER COMPRISING A GROUP 13 ELEMENT ON A SUBSTRATE

CROSS-REFERENCE TO RELATED APPLICATIONS

This application claims the benefit of U.S. Provisional Application No. 63/346,924, filed May 30, 2022, which is incorporated by reference herein in its entirety.

FIELD

The present disclosure generally relates to the field of semiconductor processing methods and systems, and to the field of integrated circuit manufacture. In particular, the present disclosure relates to methods and systems suitable for forming a layer comprising a Group 13 element, such as a layer comprising a Group 13 element and carbon or a layer comprising a Group 13 element, carbon, and a second metal, e.g., TiAlC, on a substrate. The layer may comprise the Group 13 element in elemental form, such as elemental aluminum, thereby further providing the layer with desired resistivity and work function properties for use in semiconductor devices.

BACKGROUND

The scaling of semiconductor devices, such as, for example, complementary metaloxide-semiconductor (CMOS) devices, has led to significant improvements in speed and density of integrated circuits. However, conventional device scaling techniques face significant challenges for future technology nodes.

For example, one challenge has been finding suitable conducting materials for use as a gate electrode in aggressively scaled CMOS devices. Various gate materials may be used, such as, for example, a metal, such as a titanium nitride layer. However, in some cases, where greater work function (WF) values are desired than those obtained with titanium nitride layers, e.g., in PMOS regions of a CMOS device, improved materials for gate electrodes are desired. In particular, such materials can include p-dipole shifting layers, and can be used, e.g., for threshold voltage tuning.

In addition, there remains a need for new materials in other semiconductor devices, such as MIM (metal-insulator-metal) structures, DRAM capacitors, and VNAND cells.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of forming one or more layers (hereinafter "a layer," "the layer," "layers," or "the layers") comprising a Group 13 element, carbon, and optionally a second metal on a substrate, to structures and devices formed using such methods, and to apparatus for performing the methods and/or for forming the structures and/or devices. The layers may be used in a variety of applications, including work function adjustment layers and threshold voltage adjustment layers. For example, the layers may be used in a gate electrode in n- or p-channel metal oxide semiconductor field effect transistors (MOSFETS).

In one aspect, the present disclosure relates to methods and systems for forming a layer comprising a Group 13 element on a substrate utilizing readily available and inexpensive starting materials to provide layers having low resistivity and desired work function properties that are in high demand globally. In some embodiments, the formed layer may comprise the Group 13 element along with carbon. In some embodiments, the formed layer may comprise the Group 13 element, carbon, and a second metal compound, such as a highly sought after TiAlC layer. In particular embodiments, the Group 13 element is provided in elemental form.

In another aspect, the present disclosure relates to a method of forming a layer comprising a Group 13 element on a substrate. The method comprises providing the substrate in a reaction chamber; executing the at least one deposition cycle, the at least one deposition cycle comprising: contacting the substrate with a vapor-phase first precursor (hereinafter "first precursor") to chemisorb the first precursor to the substrate, wherein the first precursor comprises a compound comprising a Group 13 element and three alkyl ligands bonded to the Group 13 element; and contacting the substrate with a vapor-phase second precursor (hereinafter "second precursor") comprising an alkyl halide to react the alkyl halide with the chemisorbed first precursor to form the layer on the substrate.

In some embodiments, the method further comprises contacting the substrate with a vapor-phase third precursor (hereinafter "third precursor") comprising a metal compound to provide a second metal to the layer, wherein the third precursor is different from the first precursor. In an embodiment, the third precursor comprises a Group 13 element different from that of the first precursor. In other embodiments, the third precursor may comprise a transition metal. In certain embodiments, the addition of the third precursor provides a method of forming a TiAlC layer on the substrate.

For the ease of description, however, the term "second metal" will be utilized to describe the metal provided to the layer by the third precursor. In some embodiments, the Group 13 element of the first precursor comprises a metal, and thus the first precursor may provide a first metal to the layer, e.g., aluminum, gallium, or indium, while the third precursor may provide a second metal. In other embodiments, however, the Group 13 metal may comprise a nonmetal, such as boron. In such instances, the second metal provided by the third precursor may be the first metal or a sole metal in the layer, but nevertheless may be referred to as a "second metal" in the layer.

In some embodiments, the process comprises a cyclic deposition process, wherein the contacting of the substrate with the first precursor, second precursor, and third precursor (when present) constitute a cycle, and the process comprises repeating said cycle at least two or more times to form the desired layer on the substrate. It is appreciated, however, that the cyclic deposition process is not limited to a particular order of precursors, e.g., first precursor, second precursor, then third precursor.

In particular embodiments, the cyclic deposition process is an atomic layer deposition (ALD) process.

In some embodiments, the method further comprises delivering a purge gas to the reaction chamber to remove the first precursor, the second precursor, and/or the third precursor (when present) from the reaction chamber after contacting the contacting of the first precursor, second precursor, and third precursor (when present) with the substrate.

In some embodiments, the cyclic deposition process is preceded by executing one or more priming steps. In an embodiment, the one or more priming steps comprise exposing the substrate to the first precursor, second precursor, and/or third precursor.

In some embodiments, the method is executed in absence of a plasma.

In some embodiments, the method is carried out until a layer having a thickness of least 0.2 nm to at most 50 nm is formed on the substrate.

In some embodiments, the substrate comprises a monocrystalline silicon wafer.

In some embodiments, the method further comprises a step of exposing the substrate to an oxygen containing gas, thereby at least partially oxidizing the layer comprising the Group 13 element, carbon, and optionally a second metal.

In another aspect of the present invention, there is provided a semiconductor device comprising a layer formed according to a method as described herein.

In yet another aspect of the present invention, there is provided a VNAND contact comprising a layer deposited according to a method as described herein.

In yet another aspect, there is provided a system comprising: a reaction chamber for holding a substrate; a source of a vapor-phase first precursor in gas communication via a first valve with the reaction chamber, wherein the vapor-phase first precursor comprises a compound comprising a Group 13 element and three alkyl ligands bonded to the Group 13 element; and a source of a vapor-phase second precursor comprising an alkyl halide in gas communication via a second valve with the reaction chamber; and a controller operably connected to the first and second valves, the controller configured and programmed to control at least one deposition cycle in the reaction chamber, the at least one deposition cycle comprising: contacting the substrate with the vapor-phase first precursor to chemisorb the first precursor to the substrate; and contacting the substrate with the vapor-phase second precursor to react the alkyl halide of the second precursor with the chemisorbed first precursor to form a layer comprising a Group 13 element on the substrate.

In some embodiments, the system further comprises a source of a vapor-phase third precursor comprising a second metal in gas communication via a third valve with the reaction chamber, wherein the controller is further operably connected to the third valve, and wherein the at least one deposition cycle further comprises contacting the substrate with the vapor-phase third precursor to provide the second metal to the layer.

These and other embodiments will become readily apparent to those skilled in the art from the following detailed description of certain embodiments having reference to the attached figures. The invention is not limited to any particular embodiments disclosed.

BRIEF DESCRIPTION OF DRAWINGS

The accompanying drawings, which are included to provide a further understanding of the disclosure and constitute a part of this specification, illustrate exemplary embodiments, and together with the description help to explain the principles of the disclosure. In the drawings.

Figure 1:
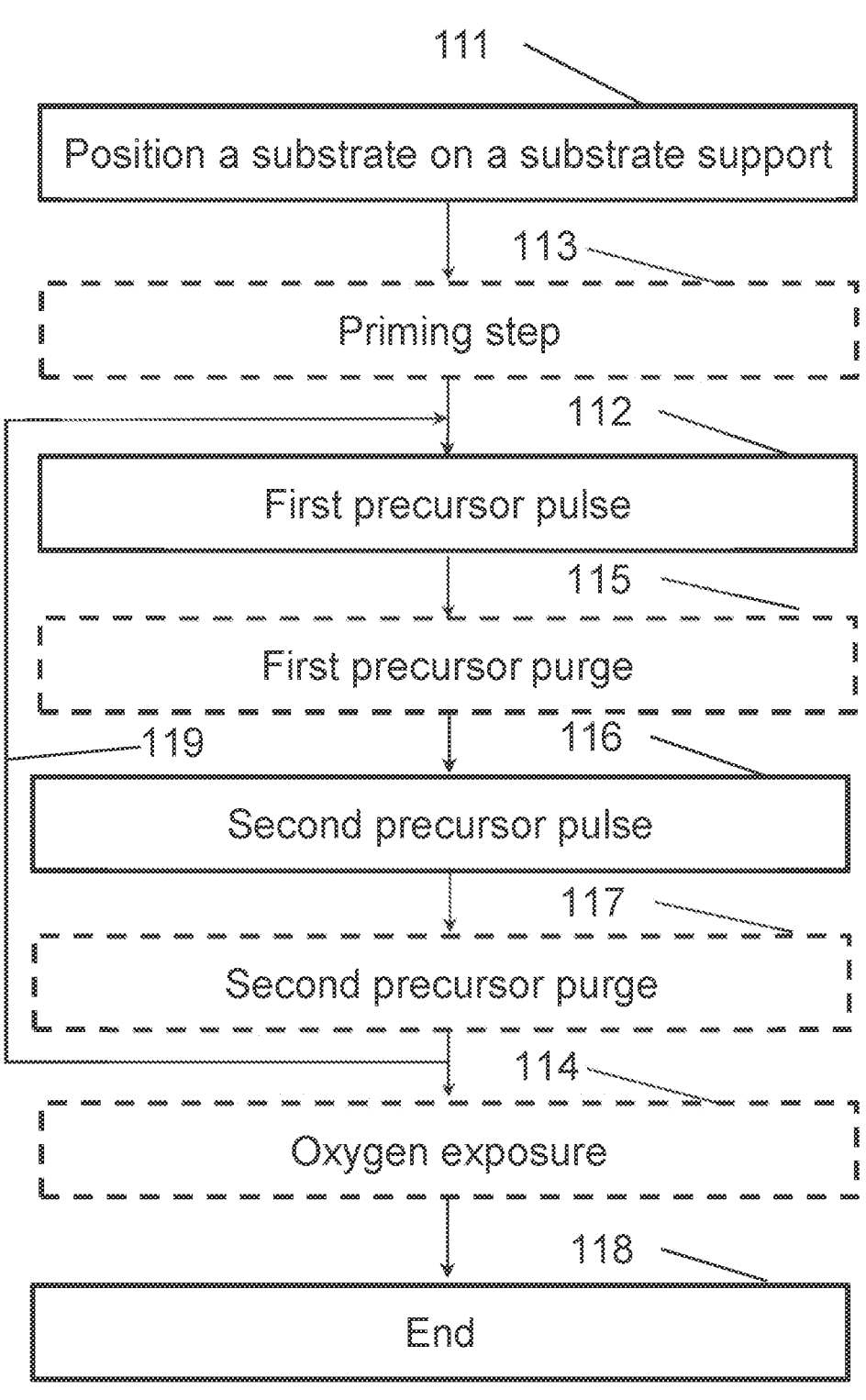
FIG. 1 illustrates an embodiment of a method as disclosed herein.

Elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and apparatuses provided below is merely exemplary and is intended for purposes of illustration only. The following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims.

It will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below. Unless otherwise noted, the exemplary embodiments or components thereof may be combined or may be applied separate from each other.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like.

As set forth in more detail below, various embodiments of the disclosure provide methods for forming structures, such as gate electrode structures. Exemplary methods can be used to, for example, to form CMOS devices, or portions of such devices. This notwithstanding, and unless noted otherwise, the invention is not necessarily limited to such examples.

In this disclosure, the term "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas, such as an inert gas. Exemplary inert gases include noble gases and molecular nitrogen. Suitable noble gases may be selected from a group consisting of He, Ne, Ar, Xe and Kr.

As used herein, the term "precursor" refers to a gas or a material that can become gaseous and that can be represented by a chemical formula that includes an element which may be incorporated during a deposition process as described herein. In some cases, the term "precursor" can refer to a compound that participates in the chemical reaction that produces another compound, and particularly to a compound that constitutes a film matrix or a main skeleton of a film. It is understood also that the term "reactant" can be used interchangeably with the term "precursor."

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. In some embodiments, the substrate can include bulk semiconductor material and an insulating or dielectric material layer overlying at least a portion of the bulk semiconductor material. Additionally or alternatively, an exemplary substrate can comprise bulk semiconductor material and a conductive layer overlying at least a portion of the bulk semiconductor material.

As used herein, the term "layer," "film," and/or the like can refer to any continuous or non-continuous structure and material, such as material deposited by the methods disclosed herein. In some embodiments, the layer and/or film can include two-dimensional materials, three-dimensional materials, nanoparticles, partial or full molecular layers or partial or full atomic layers or clusters of atoms and/or molecules. The layer or film may partially or wholly consist of a plurality of dispersed atoms on a surface of a substrate and/or embedded in a substrate and/or embedded in a device manufactured on that substrate. In addition, the layer or film may comprise material or a layer with pinholes and/or isolated islands. Further, the layer or film may be at least partially continuous. Still further, the layer or film may be patterned, e.g., subdivided, and may be comprised in a plurality of semiconductor devices.

As used herein, a "structure" can be or include a substrate as described herein. Structures can include one or more layers overlying the substrate, such as one or more layers formed according to a method as described herein. Device portions can be or include structures.

The term "deposition process" as used herein can refer to the introduction of precursors (and/or reactants) into a reaction chamber to deposit a layer over a substrate. A "cyclic deposition process" is one type of a "deposition process." The term "cyclic deposition process" or "cyclical deposition process" can refer to the sequential introduction of precursors (and/or reactants) into a reaction chamber to deposit a layer over a substrate and includes processing techniques, such as atomic layer deposition (ALD), cyclic chemical vapor deposition (cyclic CVD), and hybrid cyclic deposition processes that include an ALD component and a cyclic CVD component.

The term "atomic layer deposition" can refer to a vapor deposition process in which deposition cycles, typically a plurality of consecutive deposition cycles, are conducted in a process chamber (i.e., reaction chamber). The term "atomic layer deposition," as used herein, is also meant to include processes designated by related terms, such as chemical vapor atomic layer deposition, atomic layer epitaxy (ALE), molecular beam epitaxy (MBE), gas source MBE, organometallic MBE, and chemical beam epitaxy, when performed with alternating pulses of precursor(s)/ reactive gas(es), and purge (e.g., inert carrier) gas(es).

Generally, for ALD processes, during each cycle, a precursor is introduced to a reaction chamber and is chemisorbed to a deposition surface (e.g., a substrate surface that can include a previously deposited material from a previous ALD cycle or other material). The chemisorbed precursor may comprise about a monolayer or sub-monolayer of material that does not readily react with additional precursor (i.e., a self-limiting reaction). Thereafter, a reactant (e.g., another precursor or reaction gas) may subsequently be introduced into the process chamber for use in converting the chemisorbed precursor to the desired material on the deposition surface. In some embodiments, subsequent reactant may be capable of further reaction with the precursor. Purging steps can be utilized within or during one or more cycles, e.g., during each step of each cycle, to remove any excess precursor from the process chamber and/or remove any excess precursor(s) and/or reaction byproducts from the reaction chamber.

As used herein, the term "purge" may refer to a procedure in which an inert or substantially inert gas is provided to the reaction chamber in between two pulses of gases that react with each other. For example, a purge, e.g., using an inert gas such as a noble gas, may be provided between the introduction to the reaction chamber of any different precursor materials, e.g., a first vapor-phase precursor pulse and a subsequent reactant pulse (e.g., a pulse of a second precursor and/or third precursor as described herein), thus avoiding or at least minimizing gas phase interactions between the precursor and a subsequent precursor.

It shall be understood that a purge may be effected either in time or in space, or both. For example, in the case of temporal purges, a purge step can be used, e.g., in the temporal sequence of providing a first precursor to a reaction chamber, providing a purge gas to the reaction chamber, and providing a subsequent precursor to the reaction chamber, wherein the substrate on which a layer is deposited does not move. For example, in the case of spatial purges, a purge step can take the following form: moving a substrate from a first location to which a first precursor is continually supplied, through a purge gas curtain, to a second location to which a second precursor is continually supplied.

Further, in this disclosure, any two numbers of a variable may constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments.

As used herein, the term "about" refers to a value which is ±1% of the stated value.

As used herein, the term "transition metal" refers to metals of groups 3 to 12 of the periodic table, excluding lanthanides and actinides.

As used herein, the term "alkyl halide" refers to any compound including one or more halogen atoms and one or more carbon atoms.

In this disclosure, any defined meanings do not necessarily exclude ordinary and customary meanings, in some embodiments.

In accordance with an aspect, there is provided a method of forming a layer comprising a Group 13 element on a substrate. The method comprises providing the substrate in a reaction chamber; contacting the substrate with a vapor-phase first precursor to chemisorb the first precursor to the substrate, wherein the first precursor comprises a compound comprising a Group 13 element and three alkyl ligands bonded to the Group 13 element; and contacting the substrate with a vapor-phase second precursor comprising an alkyl halide to react the alkyl halide with the chemisorbed first precursor to form the layer on the substrate.

Without the invention being limited by any particular theory or mode of operation and as shown in FIG. 9, it is believed that, in some embodiments, the first precursor comprising the Group 13 element and three alkyl ligands is contacted with the substrate and chemisorbs onto the substrate surface. Thereafter, the alkyl halide is contacted with the substrate and an exchange reaction takes place on the substrate surface where one or more different alkyl groups on the substrate surface are exchanged for bulkier alkyl groups from the alkyl halide of the second precursor. By "bulkier," it is meant that at least one alkyl group of the second precursor comprises a greater number of carbons and/or a greater degree of branching compared to at least one alkyl group of the first precursor.

In some embodiments, one or more of the alkyl groups of the alkyl halide are capable of undergoing beta-hydride elimination to convert the surface aluminum species to an aluminum hydride. The aluminum hydride may then undergo further reaction to a more reduced form, e.g. elemental aluminum, which, upon continuation of the method, is incorporated into the growing layer to provide further lower resistivity and further lower effective work function properties in the layer. By a metal or another element being in "elemental form," it is herein meant that the element has an oxidation state of zero. The proportion of the elemental form of the total amount for a given metal or other element in the deposited material may vary.

In certain embodiments, a third precursor is included in the method to introduce a second metal (e.g., a different Group 13 element or a transition metal) into the formed layer to provide further desired properties, e.g., lower resistivity and/or lower effective work function, to the layer. In some embodiments, a purge step is performed between any two precursors.

The first precursor for use herein comprises a Group 13 element and three alkyl ligands bonded to the Group 13 element. In some embodiments, the Group 13 element comprises a member selected from the group consisting of aluminum, gallium, indium, and boron. In some embodiments, the Group 13 element comprises a member selected from the group consisting of aluminum, gallium, and indium. In particular embodiments, the Group 13 element comprises boron.

In some embodiments, the first precursor comprises the formula, $MR_3$, wherein M=the Group 13 element and R=alkyl. In some embodiments, the alkyl comprises a C1 to C6 alkyl, e.g., methyl, ethyl, propyl, butyl, and pentyl. In some embodiments, the alkyl comprises a branched alkyl. In some embodiments, the alkyl comprises a linear alkyl. Exemplary compounds having the formula $MR_3$ include, but are not limited to, trimethylborane, triethylaluminum, triethylindium, triethylgallium, triethylborane, tripropylborane, tripropylaluminum, tripropylindium, tripropylgallium, triisopropylaluminum, triisopropylindium, triisopropylgallium, and triisopropylborane.

In one aspect, the first precursor described herein allows for the use of a widely commercially available and lower cost starting material, such as trimethylaluminum (TMA), which reacts with other such readily commercially available and lower cost starting materials to build highly stable layers having low resistivity and desired work function properties rather than synthesizing highly complex and costly precursor materials. In a particular embodiment, the first precursor comprises trimethylaluminum.

In other embodiments, the first precursor comprises the formula $MRR'2$, wherein R and R' comprise different alkyls. In some embodiments, at least one of R and R', or alternatively R and R' comprise a C1 to C6 alkyl. In some embodiments, the R and/or R' alkyl comprises a branched alkyl. In other embodiments, the R and/or R' alkyl comprises a branched alkyl. Exemplary compounds having the formula $MRR'2$ for use in the present invention include, but are not limited to $Al^tBu_2Me$, $Al^tBuMe_2$, $AlEt_2Me$, $AlEtMe_2$, $AltBu_2^tBu$, $AliPr_2Me$, $Al^iPrMe_2$, $Ga^tBu_2Me$, $Ga^tBuMe_2$, $GaEt_2Me$, $GaEtMe_2$, $GatBu_2^tBu$, $Ga^iPr_2Me$, $Ga^iPrMe_2$, $In^tBu_2Me$, $IntBuMe_2$, $InEt_2Me$, $InEtMe_2$, $IntBu_2^tBu$, $In^iPr_2Me$, $In^iPrMe_2$. In the current disclosure, Me stands for methyl, Et stands for ethyl, Pr stands for propyl, $^iPr$ stands for isopropyl, $^iBu$ stands for isobutyl and $^tBu$ stands for tert-butyl.

In some embodiments, the first precursor comprises a monomer, dimer, or a mixture of a monomer or a dimer of the compound comprising the Group 13 element. For example, trimethyl aluminum may exist as a mixture of a dimer and a monomer.

Without limiting the current disclosure to any specific reaction mechanism, the second precursor may comprise any suitable alkyl halide compound that can exchange at least alkyl group for an alkyl group on the substrate surface, such as those provided by the first precursor, and are capable of undergoing beta-hydride elimination. In some embodiments, the alkyl groups of the second precursor are bulkier, e.g., at least one alkyl group of the second precursor comprises a greater number of carbons and/or a greater degree of branching, compared to at least one alkyl group of the first precursor.

In an embodiment, the halogen of the alkyl halide comprises a member selected from the group consisting of iodine, chlorine, and bromine. In some embodiments, the halogen is selected from a group consisting of iodine and bromine. In particular embodiments, the halogen comprises iodine. In some embodiments, the halogen comprises bromine.

In some embodiments, the alkyl halide comprises two or more halogens. In some embodiments, the alkyl halide comprises two halogen atoms, and the two halogen atoms are attached to different carbon atoms. In some embodiments, the two halogen atoms are attached to adjacent carbon atoms of the alkyl halide. The halogen atoms may be the same halogen, for example bromine, iodine, fluorine or chlorine. Alternatively, the halogens may be different halogens, such as iodine and bromine, bromine and chlorine, chlorine and iodine. In some embodiments, the alkyl halide comprises one halogen atom. In some embodiments, the alkyl halide comprises three halogen atoms. In some embodiments, the alkyl halide comprises four halogen atoms. In some embodiments, the alkyl halide comprises at least four halogen atoms.

In some embodiments, the alkyl group comprises a C2-C8 alkyl halide, which may be linear, branched, or aromatic. In certain embodiments, the alkyl halide comprises the formula $C_aH_bX_c$, wherein a=2-8 and b+c=2a+2. In some embodiments, the alkyl halide comprises, consists essentially of or consists of a C3 to C8 cyclic alkyl halide, such as a halogenated cyclopropane, a halogenated cyclobutane, halogenated cyclopentane or a halogenated cyclohexane. In some embodiments, the alkyl halide comprises, consists essentially of or consists of a halogenated benzene, or a phenyl group-containing compound.

In some embodiments, the alkyl halide is an iodoalkyl. In some embodiments, the alkyl halide is a bromoalkyl. In some embodiments, the alkyl halide is a chloroalkyl. In particular embodiments, the alkyl halide is selected from the group consisting of iodoethane, tert-butyl iodide, diiodoethane, such as 1,2-diiodoethane, triiodoethane, tetraiodoethane, and 1,3-diiodopropane.

In some embodiments, the alkyl group of the alkyl halide comprises any alkyl group capable of undergoing beta-hydride elimination upon reaction with the first precursor. In some embodiments, the halogen of the alkyl halide is bonded to a secondary or tertiary carbon atom. In particular embodiments, the halogen of the alkyl halide is bonded to a tertiary carbon atom. In some embodiments, prevent undesired reaction byproducts, the alkyl halide comprises only saturated alkyl groups.

In some embodiments, the alkyl halide comprises a secondary or a tertiary halide. Without limiting the current disclosure to any specific theory, branching of the alkyl chain may influence the reactivity of the halogen in a positive manner. In some embodiments, the alkyl halide comprises a branched C4 to C8 alkyl bonded to the halogen through a tertiary carbon atom. In other words, the halogen is bonded to a carbon atom, which again is attached to three carbon atoms (the three "branching carbon atoms"). Such alkyl groups may create steric effects to reactions and the spatial orientation of the atoms also may affect bond strength. Since, in these embodiments, the carbon atom being bonded to the halogen is connected to three other carbon atoms, the smallest alkyl group, in some embodiments, is a tert-butyl group. In some embodiments, the alkyl halide comprises a secondary bromine. In some embodiments, the alkyl halide comprises a tertiary bromine. In some embodiments, the alkyl halide comprises a secondary iodine. In some embodiments, the alkyl halide comprises a tertiary iodine.

In some embodiments, any one of the three branching carbon atoms may have one or more additional carbon atoms attached thereto. Often, there are one or two further carbon atoms attached to a branching carbon atom. In some embodiments, one or two of the three branching carbon atoms have one or more further carbon atoms attached to it. In some embodiments, all three of the branching carbon atoms have further carbon atoms attached to them. In such embodiments, one of the branching carbon atoms may have one additional carbon atom attached to it. In some embodiments, the alkyl group comprises a C4 to C6 alkyl. In some embodiments, one branching carbon atom may have two further carbon atoms attached to it. Alternatively, two of the branching carbon atoms may have one further carbon atom attached to each branching carbon atom.

In some embodiments, the alkyl groups of the alkyl halide are identical. Having identical alkyl groups may simplify the precursor synthesis process compared to having different alkyl groups.

When provided herein, the third precursor may comprise any compound that provides a desired metal to the formed layer. In some embodiments, the third precursor comprises a compound, which may also be suitable for use as the first precursor, but with the distinction that the third precursor comprises a Group 13 element different from the Group 13 element of the first precursor. In this way, the third precursor can provide an additional Group 13 element to the formed layer. In an embodiment, for example, the Group 13 element of the first precursor comprises aluminum while the Group 13 element of the third precursor comprises indium.

In other embodiments, the third precursor comprises a transition metal precursor to provide a transition metal to the layer. In some embodiments, the transition metal precursor comprises at least one of tantalum, hafnium, vanadium, zirconium, niobium, molybdenum, tungsten, and titanium. In some embodiments, the transition metal precursor comprises at least one of titanium and vanadium. In some embodiments, the third precursor comprises scandium.

In some embodiments, the third precursor further comprises a halogen. For example, the halogen can be selected from fluorine, chlorine, bromine, and iodine. In some embodiments, the halogen comprises chlorine.

The third precursor can comprise a transition metal in any suitable oxidation state. For example, the transition metal precursor can comprise a transition metal in oxidation state +2, +3, +4, or +5. In some embodiments, the third precursor comprises a transition metal in oxidation state +4. In some embodiments, the third precursor comprises Ti in a +4 oxidation state.

In some embodiments, the third precursor comprises a titanium precursor. Suitable titanium precursors include halides therein. Thus, in some embodiments, the titanium precursor comprises a titanium halide such as titanium chloride, titanium fluoride, titanium bromide, or titanium iodide. In some embodiments, the titanium precursor comprises one or more compounds selected from titanium (II) chloride, titanium (III) chloride, titanium (IV) chloride; and a mixture thereof. In particular embodiments, the third precursor comprises $TiCl_4$.

In some embodiments, the third precursor comprises a vanadium precursor. Suitable vanadium precursors include halides. Thus, in some embodiments, the vanadium precursor comprises a vanadium halide such as vanadium chloride, vanadium fluoride, vanadium bromide, or vanadium iodide. In some embodiments, the vanadium precursor comprises one or more compounds selected from vanadium (II) chloride, vanadium (III) chloride, vanadium (IV) chloride, and mixtures thereof.

In some embodiments, the third precursor comprises a hafnium precursor. Suitable hafnium precursors include halides. Thus, in some embodiments, the hafnium precursor comprises a hafnium halide such as hafnium chloride, hafnium fluoride, hafnium bromide, or hafnium iodide. In some embodiments, the hafnium precursor comprises one or more compounds selected from hafnium (II) chloride, hafnium (III) chloride, hafnium (IV) chloride; and a mixture thereof. In some embodiments, the third precursor comprises $HfCl_4$ or $HfBr_4$.

Without limitation, when a third precursor is utilized, the formed layer may comprise a member selected from the group consisting of TiAlC, AlInC, AlGaC, AlMoC, VAlC, ZrAlC, HfAlC and NbAlC. In a particular embodiment, the formed layer comprises TiAlC and the layer is formed by one or more deposition cycles comprising contacting the substrate trimethyl aluminum, tert-butyl iodide, and titanium chloride ($TiCl_4$).

The layer(s) formed by the methods described herein may be useful, for example, as gate stack work function tuning metals in P- or N-MOSFETs. Additionally or alternatively, they may be used in MIM (metal-insulator-metal) metal electrodes and/or in VNAND contacts. They can offer low resistivity, e.g., a lower resistivity, compared to titanium nitride layers, even at very low thicknesses, e.g., thicknesses below 4 nm. Advantageously, this low resistivity can be obtained over a wide range of deposition temperatures, and the layer(s) been surprisingly found to remain stable over an extended period, e.g., over 3 days.

In some embodiments, the process is carried out as a cyclic deposition process. The cyclic deposition process can include a cyclic CVD, ALD, or a hybrid cyclic CVD/ALD process. For example, in some embodiments, the growth rate of a particular ALD process may be low compared with a CVD process. One approach to increase the growth rate may be that of operating at a higher deposition temperature than that typically employed in an ALD process, resulting in some portion of a chemical vapor deposition process, i.e., of non-self-limiting gas phase reactions, but still taking advantage of the sequential introduction of reactants. Such a process may be referred to as cyclic CVD.

In some embodiments, the cyclic CVD process may comprise the introduction of two or more precursors, e.g., the first, second, and optional third precursor, into the reaction chamber, wherein there is a time period of overlap between the two or more precursors in the reaction chamber, thereby resulting in both an ALD component of the deposition and a CVD component of the deposition. This is referred to as a hybrid process. In some embodiments, a cyclic deposition process may comprise a continuous flow of one precursor and periodic pulsing of a second precursor into the reaction chamber.

In some embodiments, a layer formed in accordance with an embodiment of this disclosure has a step coverage equal to or greater than about 50%, or greater than about 80%, or greater than about 90%, or about 95%, or about 98%, or about 99% or greater, in/on structures having aspect ratios (height/width) of more than about 2, more than about 5, more than about 10, more than about 25, more than about 50, more than about 100, or between about 10 and 100 or about 5 to about 25. It shall be understood that the term "step coverage" refers to the growth rate of a layer on a distal surface of a recess, divided by the growth rate of that layer on a proximal surface of the recess, and expressed as a percentage. Further, it shall be understood that a distal portion of a gap feature refers to a portion of the gap feature which is relatively far removed from a substrate's surface, and that the proximal portion of a gap feature refers to a part of the gap feature which is closer to the substrate's surface compared to the distal/lower/deeper portion of the gap feature.

In some embodiments, a layer deposited by a method as described herein comprises the Group 13 element in elemental form, such as aluminum, gallium, indium, and/or boron in elemental form. In some embodiments, the Group 13 element is at least about 0.1 atomic percent to about 100 atomic percent, such as 0.1-50, 0.1-10, 0.1-2, 0.1-0.5 atomic percent, for example, 0.2, 0.5, 1, 3, 8, 12, or 25 atomic percent. In some embodiments, the layer comprises from at least 0.1 atomic percent to at most 20.0 atomic percent of the Group 13 element in elemental form, such as from at least 0.01 atomic percent to at most 0.02 atomic percent of the Group 13 element in elemental form, or from at least 0.02 atomic percent to at most 0.05 atomic percent of the Group 13 element in elemental form, or from at least 0.05 atomic percent to at most 0.1 atomic percent of the Group 13 element in elemental form, or from at least 0.1 atomic percent to at most 0.2 atomic percent of the Group 13 element in elemental form, or from at least 0.2 atomic percent to at most 0.5 atomic percent of the Group 13 element in elemental form, or from at least 0.5 atomic percent to at most 1.0 atomic percent of the Group 13 element in elemental form, or from at least 1.0 atomic percent to at most 2.0 atomic percent of the Group 13 element in elemental form, or from at least 2.0 atomic percent to at most 5.0 atomic percent of the Group 13 element in elemental form, or from at least 5.0 atomic percent to at most 10.0 atomic percent of the Group 13 element in elemental form, or from at least 10.0 atomic percent to at most 20.0 atomic percent of the Group 13 element in elemental form.

In some embodiments, when the method is performed as a cyclic deposition process, the plurality of deposition cycles is preceded by executing one or more priming steps. It shall be understood that a priming step comprises exposing the substrate to a precursor, such as the first precursor, the second precursor, and/or the third precursor (when present). In some embodiments, a priming step comprises exposing the substrate to the first precursor. In some embodiments, a priming step comprises exposing the substrate to the second precursor and/or third precursor (when present). In some embodiments, a priming step comprises exposing the substrate to molecular hydrogen. In some embodiments, a priming step comprises exposing the substrate to hydrogen plasma. A priming step—which does not need to be a discrete step, but may in some embodiments overlap with one or more steps of the deposition process—may, for example, avoid or reduce nucleation delay and/or activate the surface for deposition. The advantages of a priming step may be especially evident for very thin layers and/or layers requiring high uniformity.

The layer can be formed on the substrate by executing a suitable number of deposition cycles to provide the desired thickness. The total number of deposition cycles comprised in a method as described herein depends, inter alia, on the total layer thickness that is desired. In some embodiments, the method comprises at least 2 deposition cycles to at most 5 deposition cycles, or from at least 5 deposition cycles to at most 10 deposition cycles, or from at least 10 deposition cycles to at most 20 deposition cycles, or from at least 20 deposition cycles to at most 50 deposition cycles, or from at least 50 deposition cycles to at most 100 deposition cycles, or from at least 100 deposition cycles to at most 200 deposition cycles, or from at least 200 deposition cycles to at most 500 deposition cycles, or from at least 500 deposition cycles to at most 1000 deposition cycles, or from at least 1000 deposition cycles to at most 2000 deposition cycles, or from at least 2000 deposition cycles to at most 5000 deposition cycles, or from at least 5000 deposition cycles to at most 10000 deposition cycles.

In some embodiments, the layer thus formed has a thickness from at least 0.2 nm to at most 50 nm, at least 5 nm to at most 50 nm, at least 10 nm to at most 40 nm, at least 15 nm to at most 30 nm, at least 25 nm to at most 40 nm. In other embodiments, the layer thus formed has a thickness from at least 0.2 nm to at most 5 nm, or from at least 0.3 nm to at most 4 nm, or from at least 0.4 nm to at most 3 nm, or from at least 0.5 nm to at most 2 nm, or from at least 0.7 nm to at most 1.5 nm or of at least 0.9 nm to at most 1.0 nm.

In some embodiments, the layer thus formed has a thickness of at most 5.0 nm, or a thickness of at most 4.0 nm, or a thickness of at most 3.0 nm, or a thickness of at most 2.0 nm, or a thickness of at most 1.5 nm, or a thickness of at most 1.0 nm, or a thickness of at most nm, or a thickness of at most 0.6 nm, or a thickness of at most 0.5 nm, or a thickness of at most 0.4 nm, or a thickness of at most 0.3 nm, or a thickness of at most 0.2 nm, or a thickness of at most 0.1 nm.

In some embodiments, the first precursor, second precursor, and/or third precursor (when present) are provided to the reaction chamber in the form of a pulse. In some embodiments, the pulse lasts from at least 0.01 s to at most 240 s, or from at least 0.02 s to at most 120 s, or from at least 0.05 s to at most 60 s, or form at least 0.1 s to at most 30 s, or form at least 0.2 s to at most 15 s, or from at least 0.25 s to at most 6.0 s, or from at least 0.5 s to at most 4.0 s, or from at least 1.0 s to at most 3.0 s. In some embodiments, the pulse lasts from at least 0.5 s to at most 20.0 s, or from at least 1.0 s to at most 12.0 s, or from at least 4.0 s to at most 8.0 s.

In some embodiments, the pulse may comprise a plurality of precursor sub-pulses. The sub-pulses may be suitably separated by one or more precursor sub-purges. In some embodiments, a precursor sub-pulse may last from at least 0.01 seconds (s) to at most 10.0 seconds (s), or from at least 0.02 seconds to at most 5.0 second, or from at least 0.5 seconds to at most 2.0 seconds, or from at least 0.7 seconds to at most 1.0 seconds. In some embodiments, a precursor sub-purge may last from at least 0.01 s to at most 30.0 s, or from at least 0.02 s to at most 20.0 s, or from at least 0.05 s to at most 10.0 s, or from at least 0.1 s to at most 5.0 s, or from at least 0.2 s to at most 2.0 s, or from at least 0.5 s to at most 1.0 s. In some embodiments, the pulse comprises from at least 2 to at most 1000 sub-pulses or from at least 5 to at most 500 sub-pulses or from at least 10 to at most 200 sub-pulses or from at least 20 to at most 100 sub-pulses.

In some embodiments, subsequent deposition cycles are separated by an inter-deposition cycle purge. In some embodiments, the duration of the inter-deposition cycle purge is from at least 0.01 s to at most 30.0 s, or from at least 0.015 s to at most 25.0 s, or from at least 0.02 s to at most 20.0 s, or from at least from at least 0.025 s to at most 10.0 s, or from at least 0.1 s to at most 5.0 s, or from at least 1.0 s to at most 3.0 s, or from at least 30 s to at most 120 s, or from at least 40 s to at most 100 s, or from at least 50 s to at most 80 s.

In some embodiments, pulses of the first, second, and/or third precursor (when present) are separated by an intra-deposition cycle purge. In some embodiments, the duration of the intra-deposition cycle purge is from at least 0.01 s to at most 120 s, or from at least 30 s to at most 60 s, or from at least 0.02 s to at most 30 s, or from at least 0.025 s to at most 10.0 s, or from at least 0.5 s to at most 8.0 s, or from at least 2.0 s to at most 6.0 s, or from at least 3.0 s to at most 5.0 s.

It shall be understood that providing purge steps between subsequent pulses or deposition cycles may suitably minimize parasitic reactions between precursors.

In some embodiments, the deposition cycles are executed in absence of a plasma. In other words, the deposition cycles are thermal, in some embodiments. In other words, and in some embodiments, the methods described herein do not include use of a plasma to form activated species for use in the deposition process.

In some embodiments, the content of the Group 13 element in the formed layer is from at least 1.0 atomic percent to at most 70.0 atomic percent, or from at least 2.0 atomic percent to at most 10.0 atomic percent, or from at least 3.0 atomic percent to at most 8.0 atomic percent, or from at least 4.0 atomic percent to at most 6.0 atomic percent, or from at least 10.0 atomic percent to at most 60.0 atomic percent, or from at least 13.0 atomic percent to at most 50.0 atomic percent, or from at least 15.0 atomic percent to at most 40.0 atomic percent, or from at least 20.0 atomic percent to at most 30.0 atomic percent. In some embodiments, the content of the Group 13 element in the layer is higher than 11.0 atomic percent.

In some embodiments, when present, the transition metal content of the formed layer is from at least 1.0 atomic percent to at most 90.0 atomic percent, or from at least 3.0 atomic percent to at most 80.0 atomic percent, or from at least 5.0 atomic percent to at most 70.0 atomic percent, or from at least 10.0 atomic percent to at most 60.0 atomic percent, or from at least 20.0 atomic percent to at most 50.0 atomic percent, or from at least 30.0 atomic percent to at most 40.0 atomic percent.

In some embodiments, the carbon content of the formed layer is from at least 1.0 atomic percent to at most 60.0 atomic percent, or from at least 3.0 atomic percent to at most 50.0 atomic percent, or from at least 5.0 atomic percent to at most 40.0 atomic percent, or from at least 10.0 atomic percent to at most 30.0 atomic percent, or from at least 15.0 atomic percent to at most 25.0 atomic percent.

In some embodiments, the elemental concentration of the layer is constant over its entire thickness, e.g. within a margin of error of at most 20 atomic percent, or of at most 10 atomic percent, or of at most 5 atomic percent, or of at most 1 atomic percent. Alternatively, the concentration of one or more elements can gradually change, e.g. increase or decrease, throughout the thickness of a layer formed by a method as described herein.

In some embodiments, the deposition is performed at a substrate temperature of less than 800° C., or of at least 100° C. to at most 600° C., or of at least 200° C. to at most 400° C. For example, the deposition is performed at a substrate temperature of 220° C. to 350° C., or at a substrate temperature of 450° C. In some embodiments, the processed disclosed therein may comprise a post treatment, such as a thermal post treatment. In some embodiments, the method comprises a thermal anneal, such as a rapid thermal anneal.

In some embodiments, the method comprises bringing the first precursor, second precursor, and/or third precursor from a suitable source of the respective material to the reaction chamber. The precursor source(s) can be suitably maintained at a temperature of at least 20° C. to at most 200° C., or at a temperature of at least 30° C. to at most 150° C., or at a temperature of at least 20° C. to at most 80° C., for example at a temperature of 50° C. or 60° C. In some embodiments, the precursor source is not heated.

In some embodiments, the one or more of the precursors are provided to the reaction chamber via a showerhead injector. In some embodiments, the showerhead injector is maintained at a showerhead injector temperature of at least 50° C. to at most 200° C., or at least to at most 180° C., or of at least 70° C. to at most 160° C., or of at least 80° C. to at most 140° C., or of at least 100° C. to at most 120° C.

In some embodiments, the presently described methods are carried out at a pressure of less than 760 Torr or of at least 0.2 Torr to at most 760 Torr, of at least 1 Torr to at most 100 Torr, or of at least 1 Torr to at most 10 Torr. In some embodiments, the layer is deposited at a pressure of at most 10.0 Torr, or at a pressure of at most 5.0 Torr, or at a pressure of at most 3.0 Torr, or at a pressure of at most 2.0 Torr, or at a pressure of at most 1.0 Torr, or at a pressure of at most 0.1 Torr, or at a pressure of at most 10-2 Torr, or at a pressure of at most or at a pressure of at most 10-4 Torr, or at a pressure of at most 10-5 Torr, or at a pressure of at least 0.1 Torr to at most 10 Torr, or at a pressure of at least 0.5 Torr to at most 8 Torr, or at a pressure of at least 1.0 Torr to at most 5.0 Torr.

In some embodiments, a layer formed by a method or apparatus as described herein has a work function (WF) of at least 4.0 eV to at most 5.6 eV, or a WF of at least 4.0 eV to at most 4.2 eV, or a WF of at least 4.2 eV to at most 4.4 eV, or a WF of at least 4.4 eV to at most 4.6 eV, or a WF of at least 4.6 eV to at most 4.8 eV, or a WF of at least 4.8 eV to at most 5.0 eV. The targeted WF depends on the application in question. Thus, in some embodiments, the deposited material has a WF of 4.1 eV to 4.2 eV. In some embodiments, the deposited material has a WF of 5.2 eV to 5.6 eV. Advantageously, such a WF can be obtained at a layer thickness of at least 0.3 nm to at most 0.5 nm, or of at least 0.5 nm to at most 1.0 nm, or of at least 1.0 nm to at most 2.0 nm, or of at least 2.0 nm to at most 5.0 nm, or of at least 5.0 nm to at most 10.0 nm, or of at least 10.0 nm to at most 20.0 nm, or of at least 20.0 nm to at most nm, or of at least 50.0 nm to at most 50.0 nm to at most 100.0 nm.

In some embodiments, a layer is grown by a method as described herein at a growth rate of at least 0.01 nm per cycle to at most 1.0 nm per cycle, or at a growth rate of at least nm per cycle to at most 0.02 nm per cycle, or at a growth rate of at least 0.02 nm per cycle to at most 0.05 nm per cycle, or at a growth rate of at least 0.05 nm per cycle to at most nm per cycle, or at a growth rate of at least 0.1 nm per cycle to at most 0.2 nm per cycle, or at a growth rate of at least 0.2 nm per cycle to at most 0.5 nm per cycle, or at a growth rate of at least 0.5 nm per cycle to at most 1.0 nm per cycle.

In some embodiments, the method further comprises a step of exposing the substrate to an oxygen containing gas. In this way, the layer formed by a method as described herein can be at least partially oxidized. Suitable oxygen-containing gases include atmospheric air, $O_2$, ozone, water, hydrogen peroxide, and mixtures thereof.

In some embodiments, the method is carried out until a layer having a thickness of least 0.2 nm to at most 50 nm is formed on the substrate.

The substrate may comprise any suitable material for its intended purpose. In some embodiments, a monocrystalline silicon wafer may be a suitable substrate. Other suitable substrates include, but are not limited to monocrystalline germanium wafers, gallium arsenide wafers, quartz, sapphire, glass, steel, aluminum, silicon-on-insulator substrates, plastics, and the like. A substrate can comprise a surface layer on which one or more layers deposited by a method as described herein is formed. Suitable surface layers include conductive layers, such as metals or certain nitrides. A suitable nitride includes titanium nitride. Other suitable surface layers include high-k dielectric layers, such as hafnium oxide.

In accordance with yet additional embodiments of the disclosure, a device, structure, or portion thereof can be formed by a method as described herein. In some embodiments, the device can include a substrate, an insulating or dielectric layer, a layer deposited by a method as described herein overlying the insulating or dielectric layer, and optionally an additional metal layer overlying the layer deposited by a method as described herein. Optionally, a further layer, e.g., a metal layer, may be provided between the layer deposited by a method as described herein and the insulating or dielectric layer. In some embodiments, the device can be or form part of, for example, a MOSFET, e.g., a pMOSFET or an nMOSFET.

In some embodiments, the MOSFET device may be a PMOS field effect transistor. Thus, further provided is a PMOS field effect transistor comprising a threshold voltage tuning layer deposited by a method as described herein. Suitably, the threshold voltage shifting layer may be comprised in a gate electrode comprised in the field effect transistor.

In some embodiments, the MOSFET device may be an NMOS field effect transistor. Thus, further provided is an NMOS field effect transistor comprising a threshold voltage tuning layer deposited by a method as described herein. Suitably, the threshold voltage shifting layer is comprised in a gate electrode comprised in the field effect transistor.

In some embodiments, there is provided a gate-all-around field effect transistor. It comprises a gate contact comprising a layer formed according to a method as described herein.

In some embodiments, there is provided a MIM metal electrode comprising a layer deposited by a method as described herein.

In some embodiments, there is provided VNAND contact comprising a layer deposited by a method as described herein.

In some embodiments, there is provided a Dynamic random-access memory (DRAM) cell electrode comprising a layer formed by a method or apparatus as described herein.

In some embodiments, there is provided a wire partially or wholly lined with a layer formed by a method as described herein. In some embodiments, the wire comprises copper. In some embodiments, the wire comprises tungsten. In some embodiments, the wire comprises a core that consists of, or that substantially consists of, copper and/or tungsten. It shall be understood that the term "wire" may refer to an interconnect or to a plurality of interconnects, which are commonly encountered in integrated circuits. The term "wire" includes bitlines, wordlines, electrical connections through vias, electrical connections embedded in a low-k dielectric, and the like.

In another aspect, there is disclosed a system configured to carry out any embodiment of a method as described or otherwise encompassed by the present description. In some embodiments, the system comprises a reaction chamber, a first precursor gas source, a second precursor gas source, optionally a third precursor gas source, and a controller. The reaction chamber comprises a substrate. The first precursor gas source comprises a precursor comprising a Group 13 element as described herein. The second precursor gas source comprises an alkyl halide as described herein. The third precursor gas source comprises a third precursor, such as a transition metal precursor or a precursor of the type supplied by the first precursor gas source, but with a different Group 13 element. The controller is configured to control gas flow from the respective sources into the reaction chamber to form a layer on the substrate by a method as described herein. In some embodiments, the system further comprises a source of a purge gas, such as an inert gas, to deliver an amount of a purge gas to the reaction chamber as described herein. The controller may be in electrical communication with one or more sensors or valves to control flow from the gas sources to the valve.

FIG. 1 shows a schematic representation of an embodiment of a method as described herein. The method (100) can be used to, for example, form a gate electrode structure suitable for NMOS, PMOS, and/or CMOS devices, such as for use as a work function metal in a gate, source, or drain electrode of a metal oxide semiconductor. However, unless otherwise noted, the presently described methods are not limited to such applications. The method according to FIG. 1 comprises a phase (111) of providing a substrate, such as by positioning a substrate on a substrate support. The substrate support is positioned in a reaction chamber. Suitable substrate supports include pedestals, susceptors, and the like.

Thereafter, a pulse (112) of the first precursor is then carried out. During the first precursor pulse, the first precursor comprising a Group 13 element is provided to the reaction chamber.

Optionally, the reaction chamber is then purged (115) of the first precursor by providing an inert gas to the reaction chamber. Purging can be done, for example, by delivering a noble gas to the reaction chamber. Exemplary noble gases include He, Ne, Ar, Xe, and Kr. Alternatively or in addition, purging may be done by providing $N_2$, or a combination of $N_2$ and a noble gas, such as Ar, to the reaction chamber. In other embodiments, the purging can comprise transporting the substrate through a purge gas curtain. The purge gas curtain may comprise any of the gases listed above. During a purge, surplus chemicals and reaction byproducts, if any, can be removed from the substrate surface or reaction chamber, such as by purging the reaction space or by moving the substrate, before the substrate is contacted with the next precursor.

In some embodiments, a second precursor pulse (116) comprising an alkyl halide as described herein is carried out. Optionally, the reaction chamber is then purged (117) with a purge gas. Alternatively, the purge can comprise transporting the substrate through a purge gas curtain. A deposition cycle comprising the first precursor pulse (112) and the second precursor pulse (116) is repeated (119) one or more times. In some embodiments, the method may further comprise a third precursor pulse, which provides, for example, another Group 13 element or a transition metal to the formed layer. The third precursor pulse may likewise be followed by a purge with a purge gas. In any case, the method (100) may be continued by repeating deposition cycles until a layer having a pre-determined thickness is formed on the substrate. When a suitable thickness is obtained, the method can end (118) or subsequent layers can be deposited on top of the layer formed by the method (100).

In some embodiments, the substrate can be exposed to an oxygen-containing gas, such as $O_2$, once the deposition process is complete and/or before another layer is deposited on top of the layer formed by a method as described herein. Such a post-deposition oxidation step (114) can suitably be used to further tune the effective work function of an electrode comprising a layer formed by a method as described herein. Optionally, the deposition cycles are preceded by a priming step (113). The priming step (113) can comprise exposing the substrate to any one of the first, second, and/or third precursors. Alternatively, the priming step (113) can comprise exposing the substrate to the first precursor. The priming step (113) can enhance layer quality. Additionally or alternatively, the priming step (113) can improve layer uniformity. Additionally or alternatively, the priming step (113) can enhance the growth rate during the first deposition cycles.

In some embodiments, the method may include heating the substrate to a desired deposition temperature within the reaction chamber. In some embodiments, the method may further include heating one or more precursor vessels to a desired precursor vessel temperature. Suitable precursor vessel temperatures are described elsewhere herein. Additionally, in some embodiments, the method may further comprise heating a gas injector, e.g., a showerhead injector, comprised in the reaction chamber to a desired injector temperature.

In some embodiments, the method may further include controlling a pressure in the reaction chamber to a desired reaction chamber pressure.

In particular embodiments, the formed layer may comprise a Group 13 element, such as aluminum, a transition metal, such as titanium, and carbon. Such a layer displays a low sheet resistance. In particular, a TiAlC layer deposited by a method as described herein may have a lower resistivity than a comparable TiN film at thicknesses below 4 nm. Also, the film's resistivity has been found to be surprisingly stable for a wide range of thicknesses and deposition temperatures. A layer deposited by a method as described herein can have a high Group 13 element, e.g., Al content. In some embodiments, the content may be in excess of 11 atomic percent, and can feature excellent elemental composition uniformity across the film. Further, a layer deposited by a method as described herein can have an effective work function at a film thickness of only 2 nm. In some embodiments, the method may have a suitable growth rate, e.g. a growth rate of 0.1 nm per cycle to 2.0 nm per cycle, e.g., a growth rate of 0.25 nm per cycle. It shall be understood that the specific growth rate and the specific effective work function value can be fine-tuned by applying routine experimentation to a desirable value, e.g., by varying process parameters.

In some embodiments, the formed layer may be incorporated into a contact of a metal-oxide-semiconductor capacitor to measure its work function. In one embodiment, the contact may comprise the following material stack: a TiN liner/a TiAlC layer deposited by a method as described herein/and a TiN cap. In certain embodiments, the effective work function of an electrode comprising a layer deposited according to an embodiment of the present disclosure can be tuned, e.g., increased or decreased, by exposing that layer to an oxygen containing gas, e.g., atmospheric air. Other suitable oxygen-containing gases include water, ozone, oxygen, hydrogen peroxide, and the like.

In some embodiments, the method may comprise transporting the substrate to different positions in a reaction chamber. In other words, the precursors may be provided as pulses, and the pulses and purges may be performed spatially instead of temporally. For example, the first precursor pulse may comprise positioning the substrate in a first precursor exposure chamber, and the second precursor pulse may comprise positioning the substrate in a second precursor exposure chamber, and the third precursor pulse may comprise positioning the substrate in a third precursor exposure chamber. In some embodiments, a multi-station chamber may be used. The purges may, in some embodiments, be suitably carried out by transporting the substrate through a purge gas curtain, i.e., through a region of a reaction chamber in which a purge gas is provided.

Figure 2:
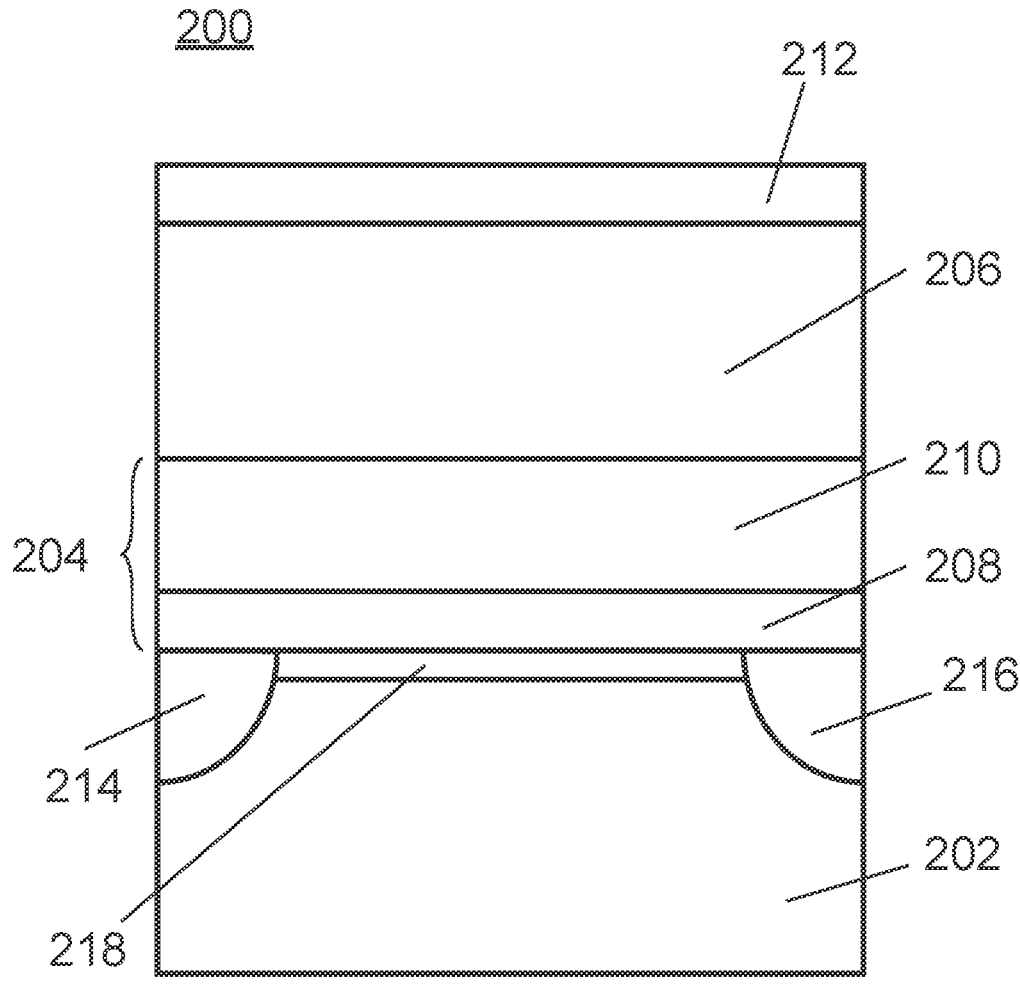
FIG. 2 illustrates an exemplary structure (200) in accordance with examples of the disclosure.

FIG. 2 illustrates an exemplary structure (200) in accordance with another aspect of the present disclosure. The device or structure (200) includes a substrate (202), a dielectric or insulating material (204), and a layer (206) that is deposited according to a method as described herein. In the illustrated embodiment, the structure (200) also includes an additional conducting layer (212).

Additionally, in the illustrated embodiment, the substrate (202) includes a source region (214), a drain region (216), and a channel region (218). Although illustrated as a horizontal structure, structures and devices in accordance with the present disclosure can include vertical and/or three-dimensional structures and devices, such as FinFET devices, and gate-all-around MOSFETs.

Figure 3:
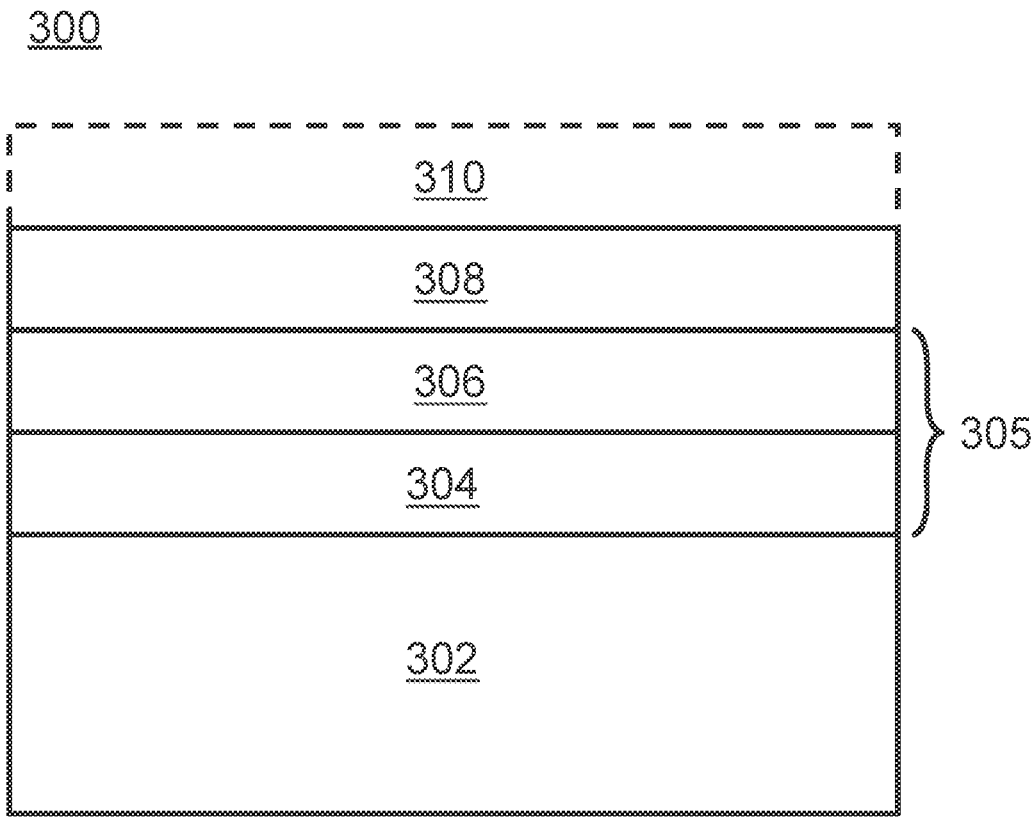
FIG. 3 illustrates a structure/a portion of a device (300) in accordance with additional examples of the disclosure.

FIG. 3 illustrates a structure/a portion of a device (300) in accordance with another aspect of the present disclosure. The device or structure (300) includes a substrate (302), a dielectric or insulating material (305), and a layer (308), which is formed according to a method as described herein. In the illustrated example, the structure (300) also includes an additional conducting layer (310). The substrate (302) can be or include any of the substrate materials described herein.

The dielectric or insulating material (305) can include one or more dielectric or insulating material layers. By way of example, the dielectric or insulating material (305) can include an interface layer (304) and a high-k material (306) deposited overlying interface layer (304). In some cases, the interface layer (304) may not exist or may not exist to an appreciable extent. The interface layer (304) can include an oxide, such as a silicon oxide, which can be formed on a surface of the substrate (302) using, for example, a chemical oxidation process or an oxide deposition process. The high-k material (306) can be or can include, for example, a metallic oxide having a dielectric constant greater than about 7.

In some embodiments, the high-k material has a dielectric constant higher than the dielectric constant of silicon oxide. Exemplary high-k materials include one or more of hafnium oxide ($HfO_2$), tantalum oxide ($Ta_2O_5$), vanadium oxide ($VO_2$), zirconium oxide ($ZrO_2$), niobium oxide ($Nb_2O_5$), titanium oxide ($TiO_2$), aluminum oxide ($Al_2O_3$), lanthanum oxide ($La_2O_3$), mixtures thereof, and laminates thereof. Other exemplary high-k materials include silicates such as hafnium silicate ($HfSiO_x$), lanthanum silicate ($LaSiO_x$), titanium silicate ($TiSiO_x$), and thulium silicate ($TmSiO_x$), amongst others. In some embodiments, the high-k material may be doped.

When the layer (308) is formed using a method as described herein, a concentration of its constituents can vary from a bottom of the layer (308) to a top of the layer 308 by, for example, controlling an amount of precursor and/or reactant and/or respective pulse times during one or more deposition cycles. In some cases, the layer (308) can have a stoichiometric composition. A work function and other properties of this layer (308) can be altered by altering its composition, which again may be achieved through adjusting the process conditions based on the knowledge of those skilled in the art.

In some embodiments, the layer (308) can include impurities, such as halides, hydrogen, and the like. In some embodiments, the impurity content may be less than one atomic percent, less than 0.2 atomic percent, or less than 0.1 atomic percent, or less than 0.05 atomic percent, alone or combined.

The thickness of the layer (308) can vary according to application. In some embodiments, the layer (308) has a thickness that can be less than 5 nm or about 0.2 nm to about 5 nm, or about 0.3 nm to about 3 nm, or about 0.3 nm to about 1 nm. When used, e.g., for controlling the threshold voltage in pMOSFETS, the layer (308) may be relatively thin, which may be desirable for many applications, including work function and/or threshold voltage adjustment layers. In some embodiments, the layer (308) may have a thickness from at least 0.2 nm to at most 50 nm, at least 5 nm to at most 50 nm, at least 10 nm to at most 40 nm, at least 15 nm to at most 30 nm, at least 25 nm to at most 40 nm. In other embodiments, the layer (308) may have a thickness from at least 0.2 nm to at most 5 nm, or from at least 0.3 nm to at most 4 nm, or from at least 0.4 nm to at most 3 nm, or from at least 0.5 nm to at most 2 nm, or from at least 0.7 nm to at most 1.5 nm or of at least 0.9 nm to at most 1.0 nm. In some embodiments, the layer (308) may have a thickness of less than 0.1 nm. It shall be understood that such layers are not necessarily continuous, and may even consist of a plurality of isolated clusters of atoms and/or a plurality of isolated atoms.

In some embodiments, the layer (308) can form a continuous film at a thickness of less than <5 nm, <4 nm, <3 nm, <2 nm, <1.5 nm, <1.2 nm, <1.0 nm, or <0.9 nm. The layer (308) can be relatively smooth, with relatively low grain boundary formation. In some embodiments, the layer (308) may be amorphous, or may comprise amorphous regions. In some embodiments, the layer (308) may comprise relatively low columnar crystal structures (as compared to TiN). RMS roughness of an exemplary layer (308) containing a metal nitride can be <1.0 nm, <0.7 nm, <0.5 nm, <0.4 nm, <0.35 nm, or <0.3 nm, at a thickness of less than 10 nm.

In some embodiments, a work function of the layer (308) can be >4.0 eV, >4.1 eV, >4.2 eV, >4.3 eV, >4.4 eV, >4.5 eV, >4.6 eV, >4.7 eV, >4.8 eV, >4.9 eV, >4.95 eV, 5.0 eV. In some embodiments, a work function of the layer (308) can be <4.0 eV, <4.1 eV, <4.2 eV, <4.3 eV, <4.4 eV, <4.5 eV, <4.6 eV, <4.7 eV, <4.8 eV, <4.9 eV, <4.95 eV, or <5.0 eV, or 5.6 eV. A work function value of a gate contact can be shifted by about 30 meV to about 400 meV, or about 30 meV to about 200 meV, or about 50 meV to about 100 meV using the layer (308) compared to a gate contact not comprising such a layer (308).

The additional conducting layer (312) can include, for example, a metal, such as a refractory metal and/or a transition metal or the like.

Figure 4:
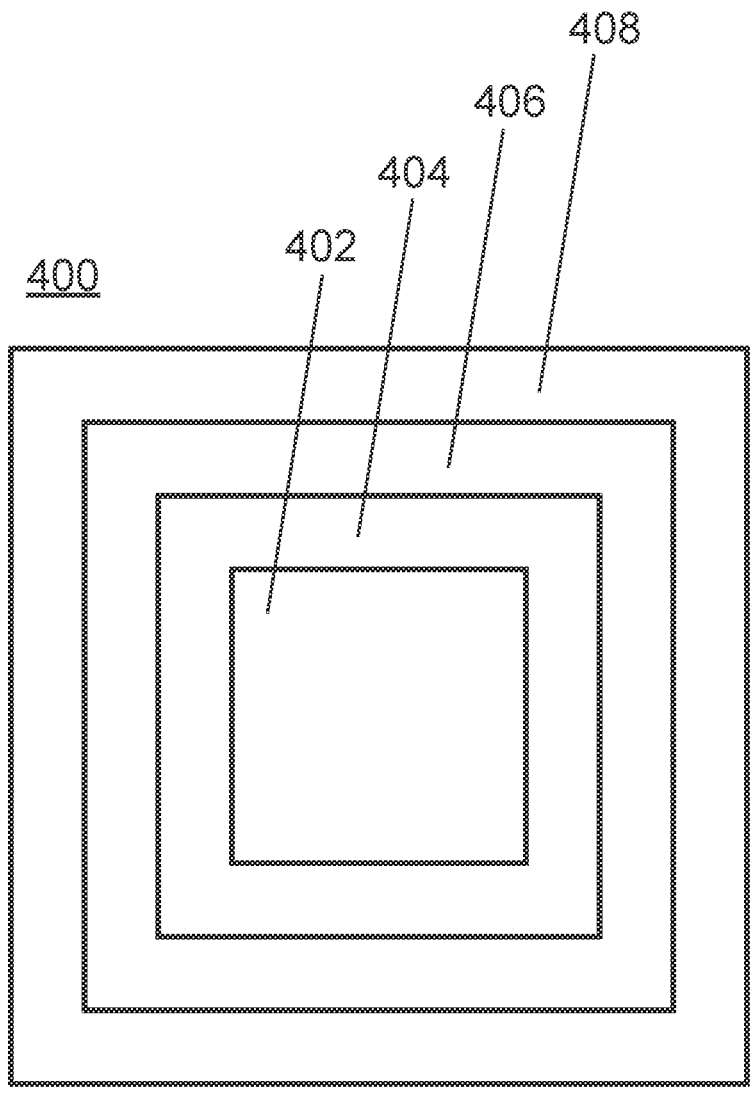
FIG. 4 illustrates another structure (400) in accordance with examples of the disclosure.

FIG. 4 illustrates another structure (400) in accordance with examples of the disclosure. This structure (400) is suitable for gate all around field effect transistors (GAA FET) (also referred to as lateral nanowire FET) devices and the like. In some embodiments, the structure (400) includes semiconductor material (402), dielectric material (404), a layer (406) formed by a method as described herein, and a conducting layer (408). As discussed above, the layer (406) may comprise a Group 13 element, carbon, and optionally another Group 13 element or a transition metal. The structure (400) can be formed overlying a substrate, including any substrate materials described herein. The layer (406) can be positioned between the conducting layer (408) and the dielectric material (406), as shown. Alternatively, the layer (406) can be positioned inside the conducting layer (408) (embodiment not shown).

The semiconductor material (402) can include any suitable semiconducting material. In some embodiments, the semiconductor material (402) can include Group IV, Group III-V, or Group II-VI semiconductor material. By way of example, the semiconductor material (402) can include silicon. The dielectric material (404) can be the same, or similar, to a dielectric, or insulating material as described herein.

Figure 5:
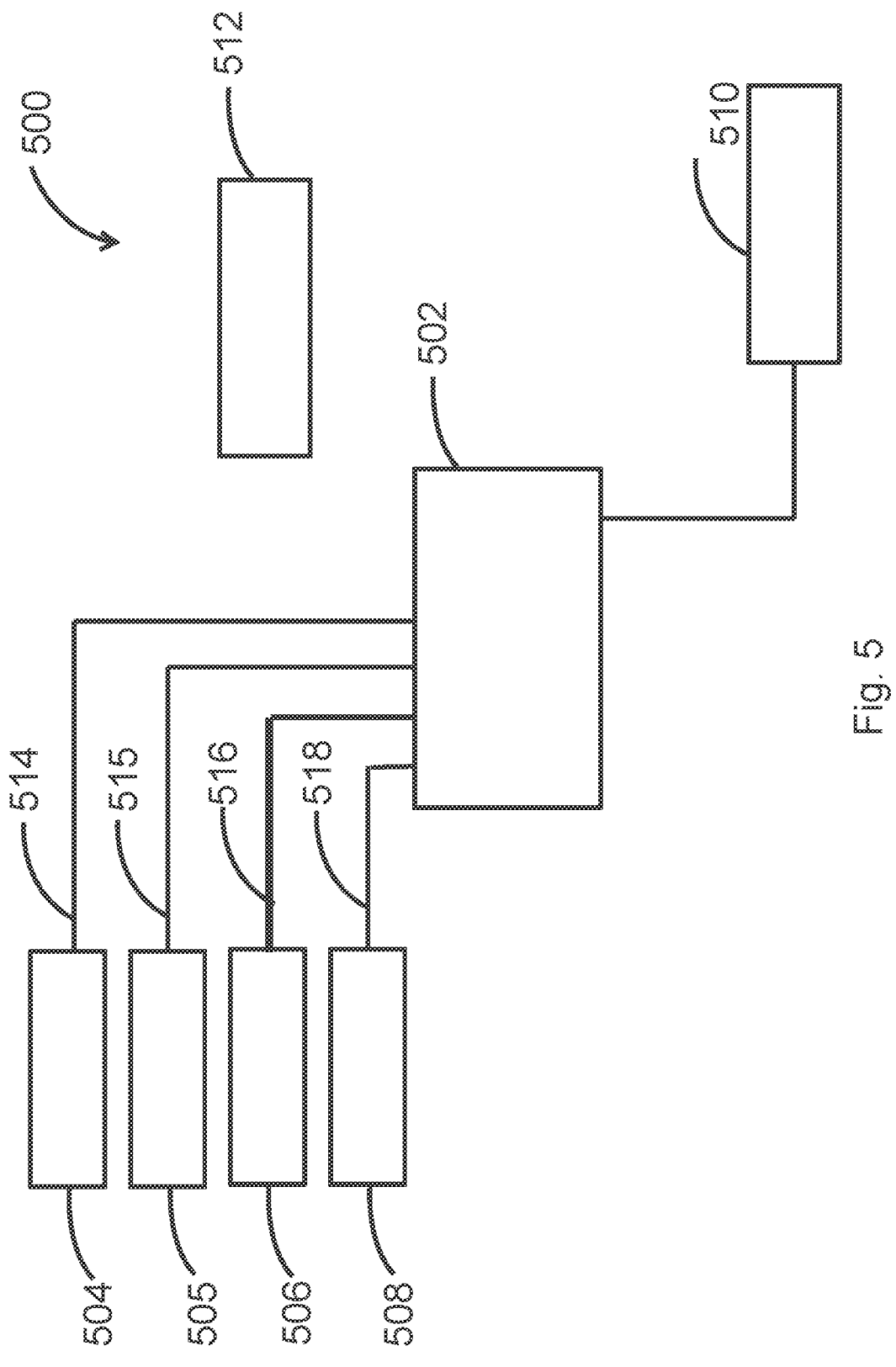
FIG. 5 illustrates a system (500) in accordance with an aspect of the present disclosure.

FIG. 5 illustrates a system (500) in accordance with another aspect of the present disclosure. The system (500) can be used to perform a method as described herein and/or form a structure or device portion as described herein.

In the illustrated example, the system (500) includes one or more reaction chambers (502), a first precursor gas source (504), a second precursor gas source (505), an optional third precursor gas source (506), a purge gas source (508), an exhaust (510), and a controller (512). The reaction chamber (502) may comprise any suitable reaction chamber, such as an ALD or CVD reaction chamber.

The first precursor gas source (504) can include a vessel and one or more first precursors as described herein—alone or mixed with one or more carrier (e.g., noble) gases. The second precursor gas source (505) can similarly include a vessel and one or more second precursors as described herein—alone or mixed with one or more carrier gases. Likewise, the third precursor gas source (506) can similarly include a vessel and one or more third precursors as described herein—alone or mixed with one or more carrier gases. The purge gas source (508) can include one or more noble gases as described herein. Although illustrated with four gas sources (504)-(508), the system (500) can include any suitable number of gas sources. The gas sources (504)-(508) can be coupled to reaction chamber (502) via lines (514)-(518), which can each include flow controllers, valves, heaters, and the like. The exhaust (510) can include one or more vacuum pumps.

The controller (512) includes electronic circuitry and software to selectively operate valves, manifolds, heaters, pumps and other components included in the system (500). Such circuitry and components operate to introduce precursors and purge gases from the respective sources (504)-(508). The controller (512) can control timing of gas pulse sequences, temperature of the substrate and/or reaction chamber, pressure within the reaction chamber, and various other operations to provide proper operation of the system (500). The controller (512) can include control software to electrically or pneumatically control valves to control flow of precursors, reactants and purge gases into and out of the reaction chamber (502). The controller (512) can include modules, such as a software or hardware component, e.g., a FPGA or ASIC, which performs certain tasks. A module can advantageously be configured to reside on the addressable storage medium of the control system and be configured to execute one or more processes.

Other configurations of the system (500) are possible, including different numbers and kinds of precursor and reactant sources and purge gas sources. Further, it will be appreciated that there are many arrangements of valves, conduits, precursor sources, and purge gas sources that may be used to accomplish the goal of selectively feeding gases into the reaction chamber (502). Further, as a schematic representation of a system, many components have been omitted for simplicity of illustration, and such components may include, for example, various valves, manifolds, purifiers, heaters, containers, vents, and/or bypasses.

During operation of the system (500), substrates, such as semiconductor wafers (not illustrated), are transferred from, e.g., a substrate handling system to the reaction chamber (502). Once substrate(s) are transferred to the reaction chamber (502), one or more gases from the gas sources (504)-(508), such as precursors, reactants, carrier gases, and/or purge gases, are introduced into the reaction chamber (502).

Figure 6:
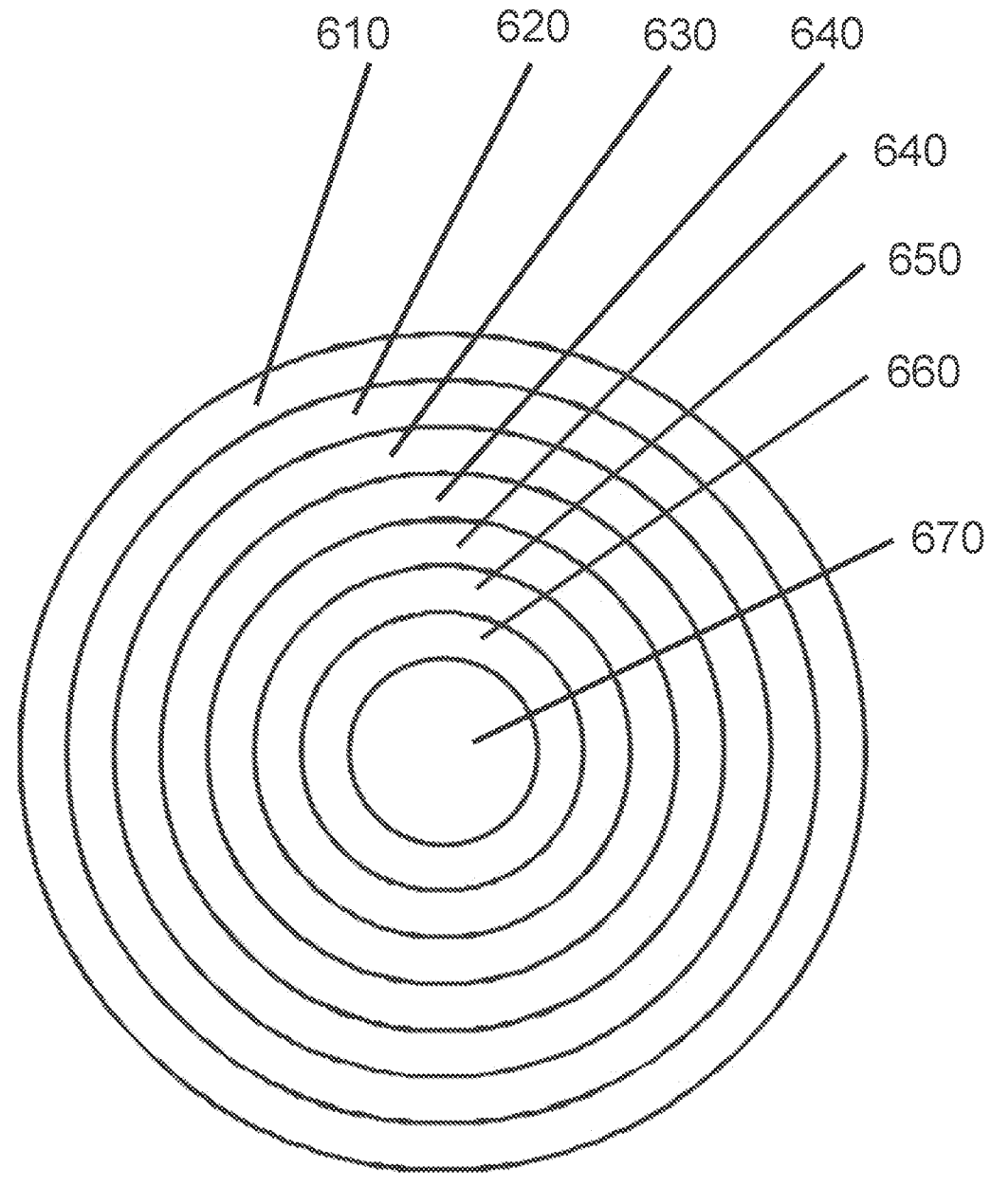
FIG. 6 illustrates an exemplary DRAM capacitor (600).

FIG. 6 illustrates an exemplary DRAM capacitor (600). It includes a top electrode (610,670) which comprises two parts, e.g., an inner shell and an outer shell. This notwithstanding, the top electrode may comprise just one part, or may comprise more than two parts, e.g., three or more parts. It shall be understood that the two parts of the top electrode (610, 670) shown in FIG. 6 are electrically connected to each other (connection not shown), i.e., it shall be understood that during normal operation, they are kept at the same, or approximately the same, electrical potential. The top electrode (610, 670) comprises a layer that is deposited by a method as described herein. The top electrode (610, 670) may, for example, have a thickness of at least 0.5 nm to 5.0 nm, or of at least 1.0 nm to at most 4.0 nm, or of at least 2.0 nm to at most 3.0 nm, or of at least 0.5 nm to at most 2.5 nm, or of at least 0.6 nm to at most 2.0 nm, or of at least 0.7 nm to at most 1.5 nm.

The DRAM capacitor (600) further comprises a bottom electrode (640). The bottom electrode (640) comprises a layer deposited by a method as described herein. In some embodiments, the composition of the bottom electrode (640) equals the composition of the top electrode (610, 670). Alternatively, the composition of the bottom electrode (640) may differ from the composition of the top electrode (610, 670). The bottom electrode (640) may, for example, have a thickness of at least 1.0 nm to at most 10.0 nm or of at least 3.0 nm to at most 7.0 nm, or of at least 0.5 nm to 5.0 nm, or of at least 1.0 nm to at most 4.0 nm, or of at least 2.0 nm to at most 3.0 nm, or of at least 0.5 nm to at most 2.5 nm, or of at least 0.6 nm to at most 2.0 nm, or of at least 0.7 nm to at most 1.5 nm. The bottom electrode (640) is separated from an outer shell of the top electrode (610) by one or more dielectric layers (620,630). The embodiment shown features two dielectric layers (620,630). The one or more dielectric layers (620, 630) may comprise a high-k dielectric. For example, the high-k dielectric may be selected from the list comprising hafnium oxide ($HfO_2$), tantalum oxide ($Ta_2O_5$), vanadium oxide ($VO_2$), niobium oxide ($Nb_2O_5$), zirconium oxide ($ZrO_2$), titanium oxide ($TiO_2$), aluminum oxide ($Al_2O_3$), lanthanum oxide ($La_2O_3$), mixtures thereof, and laminates thereof. Other exemplary high-k materials include silicates such as hafnium silicate ($HfSiO_x$), lanthanum silicate ($LaSiO_x$), titanium silicate ($TiSiO_x$), and thulium silicate ($TmSiO_x$), amongst others.

In some embodiments, the dielectric layer (620) has the same composition as dielectric layer (630). In some embodiments, dielectric layer (620) has a different composition than dielectric layer (630). The combined thickness of the two dielectric layers (620, 630) may be, for example, from at least 0.5 nm to at most 10.0 nm or of at least 1.0 nm to at most 8.0 nm, or of at least 2.0 nm to at most 6.0 nm, or of at least 3.0 nm to at most 4.0 nm. An inner shell of the top electrode (670) is separated from the bottom electrode (640) by one or more dielectric layers (650, 660). The embodiment shown features two such dielectric layers. The one or more dielectric layers (650,660) may comprise a high-k dielectric. For example, the high-k dielectric may be selected from the list comprising hafnium oxide ($HlO_2$), tantalum oxide ($Ta_2O_5$), vanadium oxide ($VO_2$), niobium oxide ($Nb_2O_5$), zirconium oxide ($ZrO_2$), titanium oxide ($TiO_2$), aluminum oxide ($Al_2O_3$) or lanthanum oxide ($La_2O_3$), and mixtures/laminates thereof. Other exemplary high-k materials include silicates such as hafnium silicate ($HfSiO_x$), lanthanum silicate ($LaSiO_x$), titanium silicate ($TiSiO_x$), and thulium silicate ($TmSiO_x$), amongst others.

In some embodiments, dielectric layer (650) has the same composition as dielectric layer (660). In some embodiments, dielectric layer (650) has a different composition than dielectric layer (660). The combined thickness of the dielectric layers (650, 660) may be, for example, from at least 0.5 nm to at most 10.0 nm or of at least 1.0 nm to at most 8.0 nm, or of at least 2.0 nm to at most 6.0 nm, or of at least 3.0 nm to at most 4.0 nm. In some embodiments, the thickness of the one or more dielectric layers (620,630) between the outer shell of the top electrode (610) and the bottom electrode (640) equals the thickness of the one or more dielectric layers (650,660) between the inner shell of the top electrode (670) and the bottom electrode (640), e.g., within a margin of error of less than 2.0 nm, or less than 1.5 nm, or less than 1.0 nm, or less than 0.5 nm, or less than 0.4 nm, or less than 0.3 nm, or less than 0.2 nm, or less than 0.1 nm. A gap filling dielectric (680) may be centrally disposed in the DRAM capacitor (680). Exemplary gap filling dielectrics include low-k dielectrics, e.g., SiOC, SiOCN, and the like.

Figure 7:
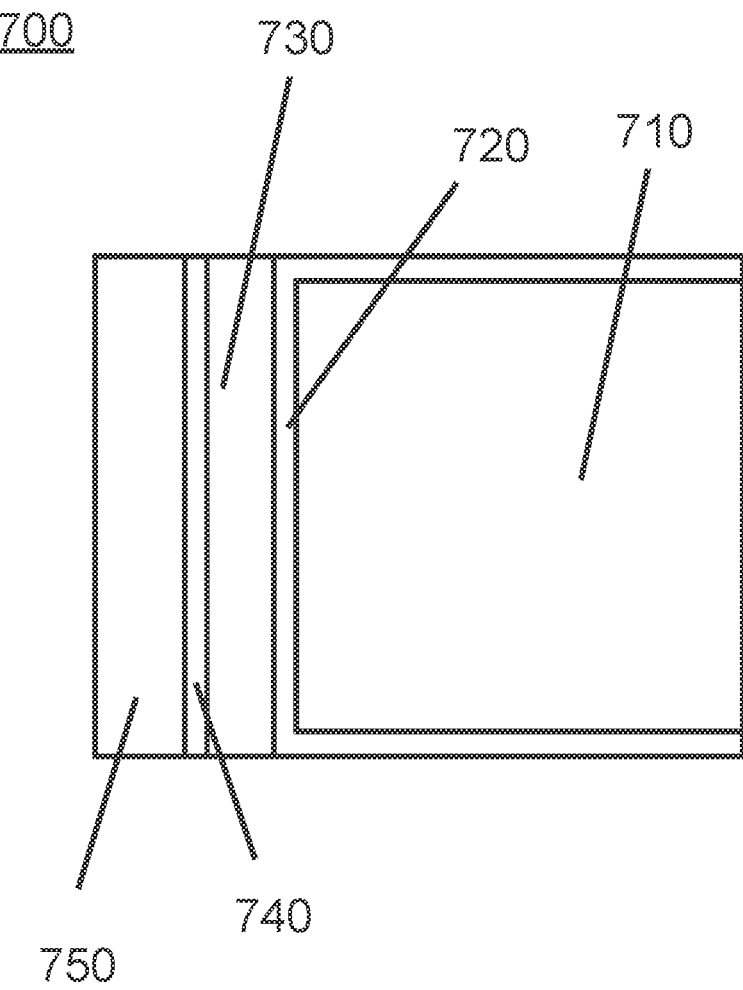
FIG. 7 illustrates a part of a VNAND cell, namely a contact and charge trapping assembly (700).

FIG. 7 illustrates a part of a VNAND cell, namely a contact and charge trapping assembly (700). The contact and charge trapping assembly (700) comprises a metal layer (710). The metal layer (710) may be made from a metal, such as copper, tungsten, etc. Alternatively, the metal layer (710) may comprise a layer deposited according to a method as described herein. As illustrated in FIG. 7, the metal layer (710) may be lined with a liner (720). The liner (720) may improve adhesion and/or may prevent or at least minimize out diffusion of metal, e.g. copper or tungsten, from the metal layer (710). Advantageously, the liner (720) comprises a layer that is deposited by a method as described herein. The contact and charge trapping assembly (700) comprises a charge trapping layer (740). The charge trapping layer (740) is positioned between two dielectric layers (730,750). The charge trapping layer may comprise a conductive layer such as, for example, silicon nitride. Additionally or alternatively, the charge trapping layer (740) may comprise a layer that is deposited by a method as described herein. One of the dielectric layers (730) is adjacent to the liner (720). This dielectric layer (730) may, for example, comprise a high-k material. For example, the high-k dielectric may be selected from the list comprising hafnium oxide (HlO$_2$), tantalum oxide (Ta$_2$O$_5$), vanadium oxide (VO$_2$), niobium oxide (Nb$_2$O$_5$), zirconium oxide (ZrO$_2$), titanium oxide (TiO$_2$), aluminum oxide (Al$_2$O$_3$) or lanthanum oxide (La$_2$O$_3$), and mixtures/laminates thereof. Other exemplary high-k dielectrics include silicates such as hafnium silicate (HfSiO$_x$), lanthanum silicate (LaSiO$_x$), titanium silicate (TiSiO$_x$), and thulium silicate (TmSiO$_x$), amongst others. In a suitable configuration in a VNAND memory architecture, the other dielectric layer (750) may serve as a tunnel layer, and may be adjacent to a doped polysilicon, channel layer (not shown).

Figure 8:
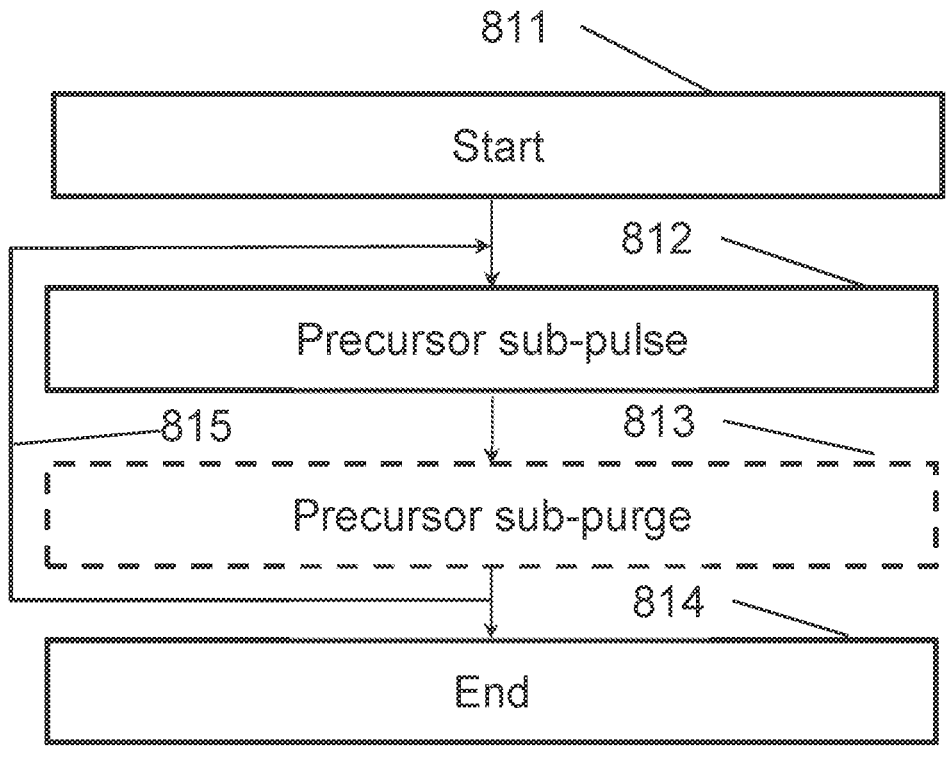
FIG. 8 shows an exemplary flow chart of an embodiment of a precursor pulse as described herein.

FIG. 8 shows an embodiment of a precursor pulse, e.g., a first, second, or third precursor pulse according to a method as disclosed herein. The precursor pulse starts (811) and a precursor sub-pulse (812) is carried out. The precursor sub-pulse is then followed by a precursor sub-purge (813). The precursor sub-pulse (812) and the precursor sub-purge (813) are then repeated (815) for a pre-determined amount of times, e.g., from at least 1 to at most times, until the precursor pulse ends (814).

Embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The invention claimed is:

1. A method of forming a layer comprising a Group 13 element on a substrate, the method comprising:
providing the substrate in a reaction chamber;
executing at least one deposition cycle; wherein the at least one deposition cycle comprises:
contacting the substrate with a vapor-phase first precursor to chemisorb the first precursor to the substrate, wherein the vapor-phase first precursor comprises a compound comprising a Group 13 element and three alkyl ligands bonded to the Group 13 element; and
contacting the substrate with a vapor-phase second precursor comprising an alkyl halide to react the alkyl halide with the chemisorbed first precursor to form the layer on the substrate, wherein a halogen of the alkyl halide is bonded to a secondary or tertiary carbon atom.

2. The method according to claim 1, wherein each of the alkyl ligands bonded to the Group 13 element comprises a C1-C6 alkyl ligand.

3. The method according to claim 1, wherein the Group 13 element is selected from the group consisting of aluminum, gallium, indium, boron, and combinations thereof.

4. The method according to claim 1, wherein the vapor-phase first precursor comprises trimethylaluminum, trimethylindium, or trimethylgallium.

5. The method according to claim 1, wherein the vapor-phase first precursor comprises a monomer, dimer, or mixture of a monomer and a dimer of the compound comprising a Group 13 element and three alkyl ligands bonded to the Group 13 element.

6. The method according to claim 1, wherein the halogen of the alkyl halide comprises a member selected from the group consisting of I, Br, and Cl.

7. The method according to claim 1, wherein the alkyl halide comprises the formula C$_a$H$_b$X$_c$, wherein a=3-8 and b+c=2a+2.

8. The method according to claim 1 wherein the alkyl halide comprises tert-butyl iodide.

9. The method according to claim 1, wherein the alkyl halide comprises a branched C4 to C8 alkyl bonded to a halogen atom through a tertiary carbon atom.

10. The method according to claim 1, wherein the alkyl halide comprises two or more halogen atoms.

11. The method according to claim 1, wherein an alkyl of the alkyl halide comprises a β-carbon relative to an α-carbon bonded to a halogen, and wherein the β-carbon comprises at least one C—H bond.

12. The method according to claim 1, wherein the layer comprises at least two different Group 13 elements.

13. The method according to claim 1, wherein the at least one deposition cycle further comprises contacting the substrate with a vapor-phase third precursor to provide a second metal to the layer.

14. The method according to claim 13, wherein the vapor-phase third precursor comprises a compound comprising a Group 13 element different from that of the vapor-phase first precursor or comprises a transition metal.

15. The method according to claim 1, wherein the layer on the substrate comprises TiAlC.

16. The method according to claim 1, wherein the method comprises a cyclic deposition process, and wherein the method comprises repeating said at least one deposition cycle a plurality of times to form the layer on the substrate.

17. A method of forming a layer comprising a Group 13 element on a substrate, the method comprising:

providing the substrate in a reaction chamber;

executing at least one deposition cycle; wherein the at least one deposition cycle comprises:

contacting the substrate with a vapor-phase first precursor to chemisorb the first precursor to the substrate, wherein the vapor-phase first precursor comprises a compound comprising a Group 13 element and three alkyl ligands bonded to the Group 13 element; and contacting the substrate with a vapor-phase second precursor comprising an alkyl halide to react the alkyl halide with the chemisorbed first precursor to form the layer on the substrate, wherein the vapor-phase first precursor comprises a monomer, dimer, or mixture of a monomer and a dimer of the compound comprising a Group 13 element and three alkyl ligands bonded to the Group 13 element.

18. The method according to claim 17, wherein an alkyl of the alkyl halide comprises a β-carbon relative to an α-carbon bonded to a halogen, and wherein the β-carbon comprises at least one C—H bond.

19. A method of forming a layer comprising a Group 13 element on a substrate, the method comprising:

providing the substrate in a reaction chamber;

executing at least one deposition cycle; wherein the at least one deposition cycle comprises:

contacting the substrate with a vapor-phase first precursor to chemisorb the first precursor to the substrate, wherein the vapor-phase first precursor comprises a compound comprising a Group 13 element and three alkyl ligands bonded to the Group 13 element; and contacting the substrate with a vapor-phase second precursor comprising an alkyl halide to react the alkyl halide with the chemisorbed first precursor to form the layer on the substrate, wherein the alkyl halide comprises a member selected from the group consisting of tert-butyl iodide, diiodoethane, iodoethane, triiodoethane, tetraiodoethane, and 1,3-diiodopropane.

20. The method according to claim 19, wherein each of the alkyl ligands bonded to the Group 13 element comprises a C1-C6 alkyl ligand.

21. The method according to claim 19, wherein the Group 13 element is selected from the group consisting of aluminum, gallium, indium, boron, and combinations thereof.

22. The method according to claim 19, wherein the vapor-phase first precursor comprises trimethylaluminum, trimethylindium, or trimethylgallium.

\* \* \* \* \*